(12) United States Patent
Kando

(10) Patent No.: US 9,882,547 B2
(45) Date of Patent: Jan. 30, 2018

(54) TUNABLE FILTER

(71) Applicant: Murata Manufacturing Co., Ltd., Nagaokakyo-shi, Kyoto-fu (JP)

(72) Inventor: Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 106 days.

(21) Appl. No.: 15/009,998

(22) Filed: Jan. 29, 2016

(65) Prior Publication Data

US 2016/0149556 A1    May 26, 2016

Related U.S. Application Data

(63) Continuation of application No. PCT/JP2014/069078, filed on Jul. 17, 2014.

(30) Foreign Application Priority Data

Aug. 21, 2013 (JP) .................. 2013-171387

(51) Int. Cl.
*H03H 9/54* (2006.01)
*H03H 9/64* (2006.01)
(Continued)

(52) U.S. Cl.
CPC .......... *H03H 9/54* (2013.01); *H03H 9/02559* (2013.01); *H03H 9/25* (2013.01);
(Continued)

(58) Field of Classification Search
CPC .......... H03H 3/04; H03H 3/10; H03H 9/0542; H03H 9/6403; H03H 2003/0464;
(Continued)

(56) References Cited

U.S. PATENT DOCUMENTS

2007/0159274 A1    7/2007    Onzuka
2008/0061906 A1    3/2008    Omura et al.
2012/0286900 A1    11/2012   Kadota et al.

FOREIGN PATENT DOCUMENTS

JP    2007-202136 A    8/2007
JP    2009-130831 A    6/2009
(Continued)

OTHER PUBLICATIONS

Machine English Translation of WO2012/114930 Published on Aug. 30, 2012.*

(Continued)

*Primary Examiner* — Robert J Pascal
*Assistant Examiner* — Jorge Salazar, Jr.
(74) *Attorney, Agent, or Firm* — Keating & Bennett, LLP

(57) ABSTRACT

A tunable filter using Love waves includes an inductance for band extension connected to each of piezoelectric resonators, variable capacitances are connected to the piezoelectric resonator, the piezoelectric resonators each include a $LiNbO_3$ substrate and an IDT electrode, and a pass band and an attenuation region are positioned in a frequency region on a lower frequency side relative to a value obtained by a calculation in which an acoustic velocity of a low-velocity transversal wave propagating in the $LiNbO_3$ substrate is divided by a wave length defined by a period of the IDT electrode.

18 Claims, 12 Drawing Sheets

(51) Int. Cl.
H03H 9/25 (2006.01)
H03H 9/02 (2006.01)
H03H 9/145 (2006.01)

(52) U.S. Cl.
CPC .......... *H03H 9/545* (2013.01); *H03H 9/6433* (2013.01); *H03H 9/1452* (2013.01); *H03H 2210/025* (2013.01)

(58) Field of Classification Search
CPC ............ H03H 9/54; H03H 9/545; H03H 9/25; H03H 9/1452; H03H 9/02559; H03H 9/6433; H03H 2210/025
USPC ................................ 333/133, 188, 193–196
See application file for complete search history.

(56) References Cited

FOREIGN PATENT DOCUMENTS

| WO | 2006/137248 A1 | 12/2006 |
|---|---|---|
| WO | 2011/093449 A1 | 8/2011 |
| WO | 2012/114930 A1 | 8/2012 |

OTHER PUBLICATIONS

Kadota, M. et al., "Band Pass Type of Tunable Filters Composed of Ultra Wide Band SAW Resonators by Adjusting Capacitors Connected SAW Resonators", IEEE International Ultrasonics Symposium Proceedings, pp. 559-562, 2011.

Official Communication issued in International Patent Application No. PCT/JP2014/069078, dated Oct. 21, 2014.

* cited by examiner

Vs/λ

US 9,882,547 B2

TUNABLE FILTER

BACKGROUND OF THE INVENTION

1. Field of the Invention

The present invention relates to tunable filters that that include elastic wave resonators including a $LiNbO_3$ substrate.

2. Description of the Related Art

For example, Japanese Unexamined Patent Application Publication No. 2009-130831 discloses a tunable filter including a serial arm resonator configured of an elastic wave resonator and a parallel arm resonator configured of an elastic wave resonator. In this tunable filter, variable capacitors are connected to the serial arm resonator in series and parallel, respectively. Similarly, variable capacitors are also connected to the parallel arm resonator in series and parallel, respectively.

In a surface acoustic wave resonator used in a tunable filter disclosed in Band Pass Type of Tunable Filters Composed of Ultra Wide Band SAW Resonators By Adjusting Capacitors connected SAW Resonators, 2011 IEEE International Ultrasonics Symposium Proceedings, a Cu electrode is embedded in a groove provided on a surface of a piezoelectric substrate. This surface acoustic wave resonator makes use of resonant characteristics provided by Love waves.

However, the tunable filter disclosed in Japanese Unexamined Patent Application Publication No. 2009-130831 has a problem that its frequency variable width is narrow.

Meanwhile, in the tunable filter disclosed in Band Pass Type of Tunable Filters Composed of Ultra Wide Band SAW Resonators By Adjusting Capacitors Connected SAW Resonators, 2011 IEEE International Ultrasonics Symposium Proceedings, a Cu electrode is embedded in a groove provided on the surface of the piezoelectric substrate used in the tunable filter. This causes a problem that the manufacturing process becomes complicated and costs are increased. In addition, a reflection coefficient per electrode finger is small; note that electrode fingers configure an interdigital transducer (IDT) electrode, a reflector, and so on. This makes a stop-band width narrow and consequently makes it difficult to obtain favorable resonant characteristics in a wide frequency region. Further, the filter characteristic is likely to deteriorate in the vicinity of an anti-resonant frequency.

SUMMARY OF THE INVENTION

Preferred embodiments of the present invention provide a tunable filter that uses Love waves, achieves excellent steepness of a filter characteristic, and widens a frequency variable width.

A tunable filter according to a preferred embodiment of the present invention includes a piezoelectric resonator, an inductance for band extension connected to the piezoelectric resonator, and a variable capacitance connected to the piezoelectric resonator, and uses Love waves. In the tunable filter, the piezoelectric resonator includes a $LiNbO_3$ substrate and an IDT electrode provided on the $LiNbO_3$ substrate, and a pass band and an attenuation region are present in a frequency region on a lower frequency side relative to a value obtained by a calculation in which an acoustic velocity of a low-velocity transversal wave propagating in the $LiNbO_3$ substrate is divided by a wave length defined by a period of the IDT electrode.

In a specific aspect of a tunable filter according to a preferred embodiment of the present invention, the tunable filter further includes an input terminal and an output terminal, and the piezoelectric resonator includes a first piezoelectric resonator that includes an elastic wave resonator and is provided in a serial arm that connects the input terminal to the output terminal, and a second piezoelectric resonator that includes an elastic wave resonator and is provided in a parallel arm that connects the serial arm to a ground potential; the inductance for band extension includes a first inductance that is connected to the first piezoelectric resonator and extends a relative band of the first piezoelectric resonator, and a second inductance that is connected to the second piezoelectric resonator and extends a relative band of the second piezoelectric resonator; and the variable capacitance includes a first variable capacitance that is connected to the first piezoelectric resonator and defines a first variable resonance circuit along with the first piezoelectric resonator and the first inductance, and a second variable capacitance that defines a second variable resonance circuit along with the second piezoelectric resonator and the second inductance.

In another specific aspect of a tunable filter according to a preferred embodiment of the present invention, the IDT electrode includes a Pt film; and in the case where a film thickness of the Pt film is taken as $H(\lambda)$ and Euler angles of the $LiNbO_3$ substrate are taken as $(\varphi, \theta, \psi)$, $\theta$ falls within a range of $-64960 \times H^3 + 19831 \times H^2 - 2068.4 \times H + 169.7 - 10°$ … (Formula 1) to $-64960 \times H^3 + 19831 \times H^2 - 2068.4 \times H + 169.7 + 6°$ … (Formula 2), $\varphi$ falls within a range of $-27°$ to $+27°$, and $\psi$ falls within a range of $-47°$ to $+47°$, for example.

In another specific aspect of a tunable filter according to a preferred embodiment of the present invention, the thickness H of the Pt film is equal to or greater than about $0.023\lambda$.

In another specific aspect of a tunable filter according to a preferred embodiment of the present invention, in the case where a thickness of the IDT electrode is taken as $H(\lambda)$ and a ratio $P/P_{Pt}$ of a density P of the IDT electrode to a density $P_{Pt}$ of Pt is taken as A, among the Euler angles $(\varphi, \theta, \psi)$, $\theta$ falls within a range of $-64960 \times (H/A)^3 + 19831 \times (H/A)^2 - 2068.4 \times (H/A) + 169.7 - 10°$ … (Formula 3) to $-64960 \times (H/A)^3 + 19831 \times (H/A)^2 - 2068.4 \times (H/A) + 169.7 + 6°$ … (Formula 4), $\varphi$ falls within a range of $-27°$ to $+27°$, and $\psi$ falls within a range of $-47°$ to $+47°$, for example.

In another specific aspect of a tunable filter according to a preferred embodiment of the present invention, the first inductance includes a first parallel inductance connected in parallel to the first piezoelectric resonator.

In another specific aspect of a tunable filter according to a preferred embodiment of the present invention, the first inductance includes a first serial inductance connected in series to the first piezoelectric resonator.

In another specific aspect of a tunable filter according to a preferred embodiment of the present invention, the second inductance includes a second serial inductance connected in series to the second piezoelectric resonator.

In another specific aspect of a tunable filter according to a preferred embodiment of the present invention, the second inductance includes a second parallel inductance connected in parallel to the second piezoelectric resonator.

In another specific aspect of a tunable filter according to a preferred embodiment of the present invention, the first variable capacitance includes at least one of a first serial variable capacitance connected in series to the first piezoelectric resonator and a first parallel variable capacitance connected in parallel to the first piezoelectric resonator.

In another specific aspect of a tunable filter according to a preferred embodiment of the present invention, the second variable capacitance includes at least one of a second serial variable capacitance connected in series to the second piezoelectric resonator and a second parallel variable capacitance connected in parallel to the second piezoelectric resonator.

In another specific aspect of a tunable filter according to a preferred embodiment of the present invention, the first and second piezoelectric resonators are provided on the same LiNbO$_3$ substrate.

According to a tunable filter according to a preferred embodiment of the present invention, a pass band and an attenuation region are present in a frequency region on a lower frequency side relative to a value obtained by the calculation in which the acoustic velocity of a low-velocity transversal wave propagating in the LiNbO$_3$ substrate is divided by a wave length defined by the period of the IDT electrode so as to propagate Love waves while reducing or eliminating leakage of the Love waves. This makes it possible to obtain a filter characteristic with low loss and excellence in steepness. In addition, since the tunable filter is provided with the inductance for band extension, the frequency variable width is able to be widened.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a plan view of the resonator and FIG. 2B is a cross-sectional view of a portion taken along a C-C line in FIG. 2A.

DETAILED DESCRIPTION OF THE PREFERRED EMBODIMENTS

Hereinafter, specific preferred embodiments of the present invention will be described with reference to the drawings so as to clarify the present invention.

Figure 1:
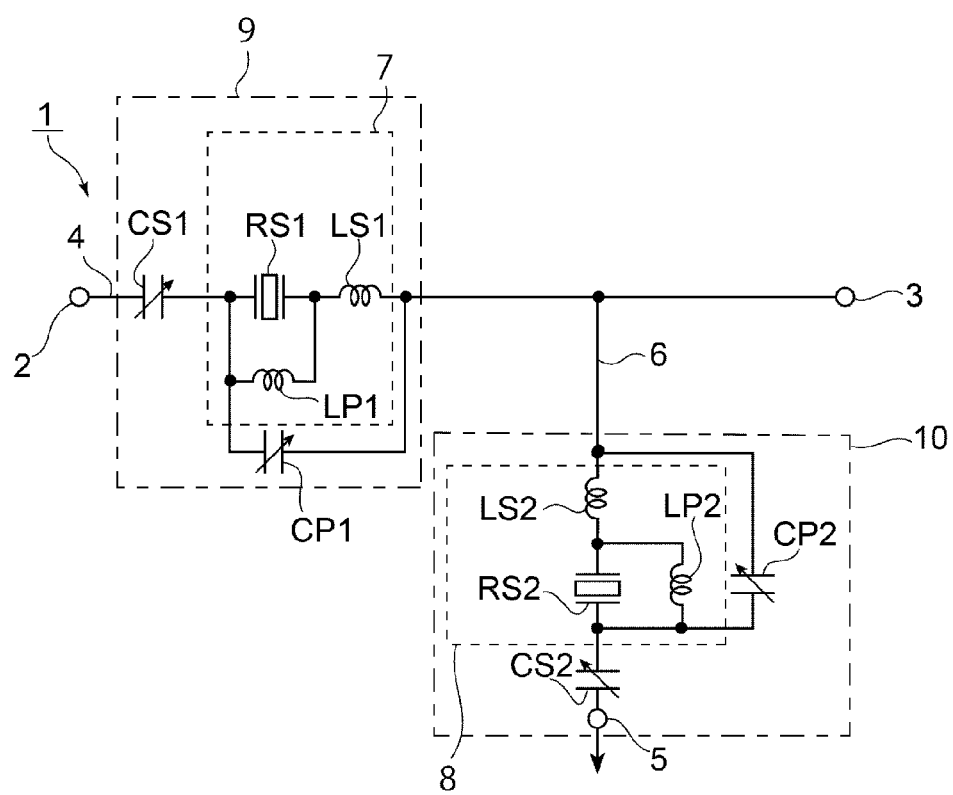
FIG. 1 is a circuit diagram of a tunable filter according to a first preferred embodiment of the present invention.

FIG. 1 is a circuit diagram of a tunable filter according to a preferred embodiment of the present invention. A tunable filter 1 of the present preferred embodiment preferably uses Love waves.

As shown in FIG. 1, the tunable filter 1 includes an input terminal 2, an output terminal 3, and a ground terminal 5. A first piezoelectric resonator RS1 is provided in a serial arm 4 connecting the input terminal 2 to the output terminal 3. The first piezoelectric resonator RS1 includes a surface acoustic wave resonator in the present preferred embodiment.

Figure 2A:
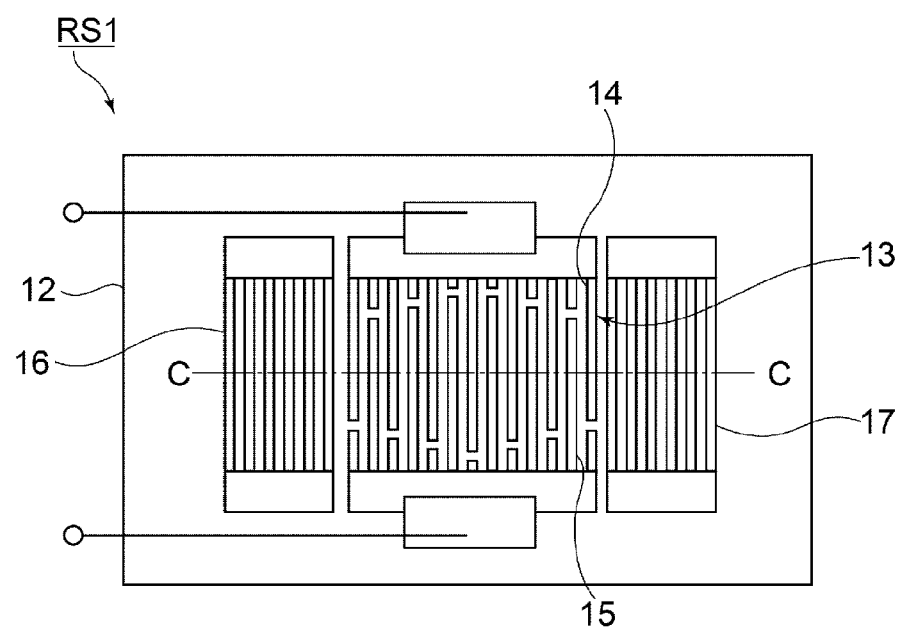
FIGS. 2A and 2B illustrate an example of a piezoelectric resonator used in a preferred embodiment of the present invention, where
Figure 2B:
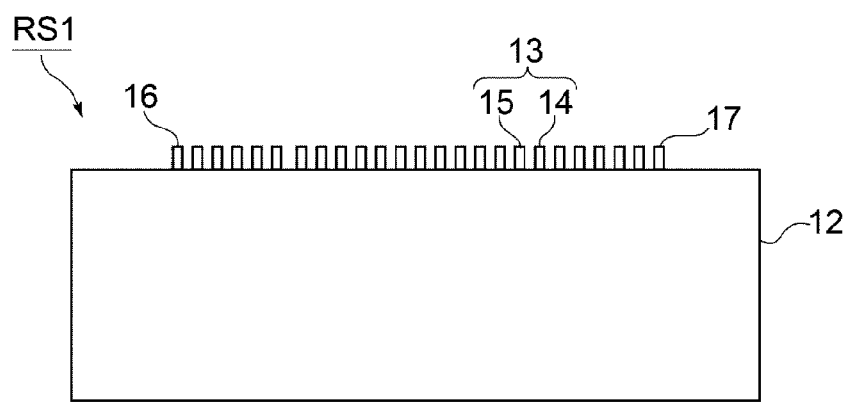

To be more specific, as shown in FIGS. 2A and 2B, the first piezoelectric resonator RS1 includes a LiNbO$_3$ substrate 12. An IDT electrode 13 is provided on the LiNbO$_3$ substrate 12. The IDT electrode 13 includes a plurality of first electrode fingers 14 and a plurality of second electrode fingers 15. The plurality of first electrode fingers 14 and the plurality of second electrode fingers 15 are interleaved with each other. Reflectors 16 and 17 are provided on both sides of the IDT electrode 13 in a propagation direction of the surface acoustic wave, respectively.

Although the IDT electrode 13 and the reflectors 16, 17 can be made of an appropriate metal, they are preferably made of a Pt film in the present preferred embodiment. The present preferred embodiment makes use of resonant characteristics provided by Love waves excited by the first piezoelectric resonator RS1.

In the first piezoelectric resonator RS1, the IDT electrode 13 can be formed on the LiNbO$_3$ substrate 12 using a thin film formation method or the like. This prevents the manufacturing process from being complicated.

Returning to FIG. 1, a first parallel inductance LP1 is connected in parallel to the first piezoelectric resonator RS1. Further, a first serial inductance LS1 is connected in series to the first piezoelectric resonator RS1. The first parallel inductance LP1 and the first serial inductance LS1 define a first inductance.

The first inductance extends a relative band of the first piezoelectric resonator RS1. Here, the relative band refers to a frequency difference between a resonant frequency and an anti-resonant frequency. In the present preferred embodiment, the first parallel inductance LP1 shifts the anti-resonant frequency of the first piezoelectric resonator RS1 toward a higher frequency side, thus extending the relative band. Meanwhile, the first serial inductance LS1 shifts the resonant frequency of the first piezoelectric resonator RS1 toward a lower frequency side.

Thus, a first resonance circuit 7 of wide band is provided as indicated by a broken line in FIG. 1.

Further, a first parallel variable capacitance CP1 is connected in parallel to the first resonance circuit 7 including the first piezoelectric resonator RS1, the first serial inductance LS1, and the first parallel inductance LP1. Furthermore, a first serial variable capacitance CS1 is connected to the first resonance circuit 7 in series.

The first parallel variable capacitance CP1 and the first serial variable capacitance CS1 define a first variable capacitance in the present invention. The first variable capacitance defines a first variable resonance circuit 9 along with the first resonance circuit 7. In other words, changing electrostatic capacitance of the first parallel variable capacitance CP1 and the first serial variable capacitance CS1 makes it possible to change frequency characteristics of the first variable resonance circuit 9.

A parallel arm 6 connects the serial arm 4 to the ground terminal 5. A second piezoelectric resonator RS2 is provided in the parallel arm 6. The second piezoelectric resonator RS2, like the first piezoelectric resonator RS1, makes use of resonant characteristics provided by Love waves. Further, the second piezoelectric resonator RS2 also has a structure in which there are provided an IDT electrode and reflectors on a $LiNbO_3$ substrate. In other words, the second piezoelectric resonator RS2 is defined by a one-port type surface acoustic wave resonator.

A second serial inductance LS2 is connected to the second piezoelectric resonator RS2 in series. A second parallel inductance LP2 is connected to the second piezoelectric resonator RS2 in parallel. The second piezoelectric resonator RS2, the second serial inductance LS2, and the second parallel inductance LP2 define a second resonance circuit 8 of wide band as indicated by a broken line.

The second serial inductance LS2 is provided in order to shift a resonant frequency Fr of the second piezoelectric resonator RS2 toward a lower frequency side. The second parallel inductance LP2 is provided in order to shift an anti-resonant frequency Fa of the piezoelectric resonator RS2 toward a higher frequency side.

In other words, the second serial inductance LS2 and second parallel inductance LP2 defining a second inductance respectively extend a relative band of the second piezoelectric resonator RS2. Accordingly, the relative band, which is a frequency region between a resonant frequency and an anti-resonant frequency of the second resonance circuit 8, is more widely extended than the frequency region between the resonant frequency and the anti-resonant frequency of the second piezoelectric resonator RS2. In this manner, the second resonance circuit 8 of wide band is provided.

A second serial variable capacitance CS2 is connected to the second resonance circuit 8 in series. Further a second parallel variable capacitance CP2 is connected to the second resonance circuit 8 in parallel.

In the parallel arm 6, the second serial variable capacitance CS2 and the second parallel variable capacitance CP2 are connected to the second resonance circuit 8 of wide band, thus defining a second variable resonance circuit 10.

Adjusting electrostatic capacitance of the second serial variable capacitance CS2 and/or electrostatic capacitance of the second parallel variable capacitance CP2 makes it possible to adjust frequency characteristics of the second variable resonance circuit 10.

The tunable filter 1 of the present preferred embodiment makes use of Love waves, and adjusting the electrostatic capacitance of the first parallel variable capacitance CP1 and the first serial variable capacitance CS1 and/or the electrostatic capacitance of the second parallel variable capacitance CP2 and the second serial variable capacitance CS2 makes it possible to adjust the frequency characteristics of the first and second variable resonance circuits 9 and 10.

In addition, in the tunable filer of the present preferred embodiment, a pass band or an attenuation band is present in a frequency region on a lower frequency side relative to a value obtained by a calculation in which an acoustic velocity of a low-velocity transversal wave propagating in the $LiNbO_3$ substrate is divided by a wave length $\lambda$ defined by a period of the IDT electrode across the overall variable frequency range discussed above. This makes it possible to reduce loss and increase steepness of the filter characteristic. Further, because the inductor for band extension is provided, the frequency variable range is widened.

In the present preferred embodiment, the tunable filter is implemented preferably with a ladder type circuit configuration. Therefore, the first serial inductance LS1 and the first parallel inductance LP1 correspond to the first inductance for band extension, and the second serial inductance LS2 and the second parallel inductance LP2 define the second inductance and expand the relative band of the second piezoelectric resonator RS2. However, the present invention is not intended to be limited to the tunable filter with a ladder type circuit. In other words, various preferred embodiments of the present invention can be applied to a tunable filter other than the above tunable filter having the ladder type circuit configuration. That is, in a tunable filter device which uses Love waves and in which a piezoelectric resonator includes a $LiNbO_3$ substrate, as long as an inductance for band extension and a variable capacitor are connected to the piezoelectric resonator, preferred embodiments of the present invention can be applied thereto. Also in this case, it is sufficient that the pass band and the attenuation region are present in a frequency region on a lower frequency side relative to a value obtained by the calculation in which an acoustic velocity of a low-velocity transversal wave propagating in the $LiNbO_3$ substrate is divided by the wave length defined by the period of the IDT electrode. This makes it possible to reduce loss, increase steepness of the filter characteristic, and widen the frequency variable range.

Hereinafter, it will be described in more detail that the present preferred embodiment reduces the loss, increases the steepness of the filter characteristic, and widens the frequency variable range.

In the case of changing the frequency, by using a variable capacitance, of a resonance circuit, the frequency variable range lies in a range between a resonant frequency and an anti-resonant frequency of the resonance circuit. For example, in the first resonance circuit 7 shown in FIG. 1, adjusting the electrostatic capacitance of the first serial variable capacitance CS1 and/or the first parallel variable capacitance CP1 makes it possible to change the frequency within a frequency range between the resonant frequency and the anti-resonant frequency of the first resonance circuit 7.

In general, a frequency variable width required to a tunable filter to be used in a cellular phone is considerably wide, ranging approximately from 700 MHz to 1000 MHz or 1600 MHz to 2700 MHz, for example. Meanwhile, a band width ratio (Fa–Fr)/Fr of a surface acoustic wave resonator using Love waves is slightly less than about 20%. As such, the band width ratios of the first piezoelectric resonator RS1 and the second piezoelectric resonator RS2 are narrow when the frequency variable width being considered. Accordingly, in the present preferred embodiment, the first resonance circuit 7 of wide band is defined by connecting the first serial inductance LS1 to the first piezoelectric resonator RS1 in series and connecting the first parallel inductance LP1 thereto in parallel. In other words, the first serial inductance LS1 shifts the resonant frequency toward a lower frequency side, and the first parallel inductance LP1 shifts the anti-resonant frequency toward a higher frequency side.

Figure 3:
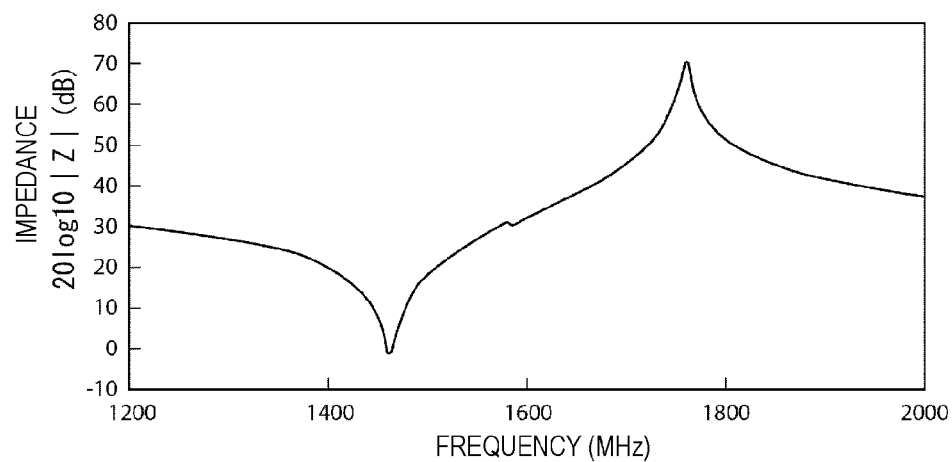
FIG. 3 is a graph illustrating an impedance characteristic of a piezoelectric resonator.
Figure 4:
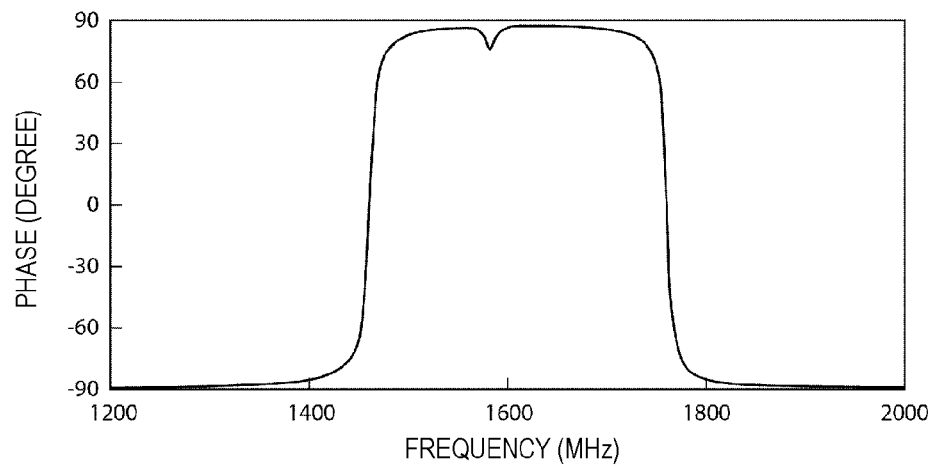
FIG. 4 is a graph illustrating a phase characteristic of a piezoelectric resonator.

FIG. 3 is a graph illustrating an example of an impedance characteristic of a piezoelectric resonator, and FIG. 4 is a graph illustrating an example of a phase characteristic thereof. In this case, the IDT electrode 13 preferably is made of Pt, and the period of its electrode fingers defined by the wave length λ preferably is about 2 µm, for example. An electrode finger intersecting width of the IDT electrode 13 preferably is about 30λ, and the number of pairs of the electrode fingers is 60, for example. Note that the LiNbO$_3$ substrate used preferably is made of LiNbO$_3$ of 15° Rotated Y cut X SAW propagation, and the thickness of the Pt film is about 0.04λ, for example.

Here, as is clear from FIGS. 3 and 4, a spurious form can be seen near 1600 MHz. This spurious is caused by a Rayleigh wave. Depending on a usage condition, this Rayleigh wave spurious needs to be suppressed in some cases. The inventors of the present invention have discovered that the spurious caused by the Rayleigh wave can be minimized by adjusting Euler angles of LiNbO$_3$ and the film thickness of the IDT electrode 13.

Figure 5:
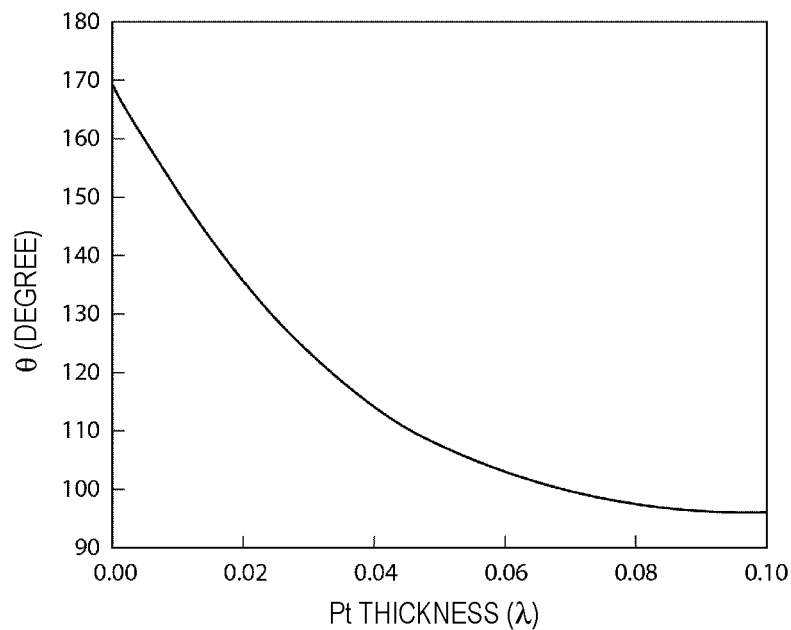
FIG. 5 is a graph illustrating a relationship between a Pt thickness and an Euler angle θ in which spurious caused by a Rayleigh wave is minimal.

FIG. 5 is a graph illustrating a relationship between a Pt thickness and θ of Euler angles (0°, θ, 0°) of LiNbO$_3$ in which an electromechanical coupling coefficient k$^2$ of the above Rayleigh wave spurious is close to zero. The Pt thickness and θ being on a curved line shown in FIG. 5, the electromechanical coupling coefficient k$^2$ of the spurious caused by the Rayleigh wave can be made close to zero. This curved line can be approximated with Formula (1A) given below in the case where the Pt thickness is taken as H(λ).

$$\theta = -64960 \times H^3 + 19831 \times H^2 - 2068.4 \times H + 169.7 \quad \text{Formula (1A)}$$

Figure 6:
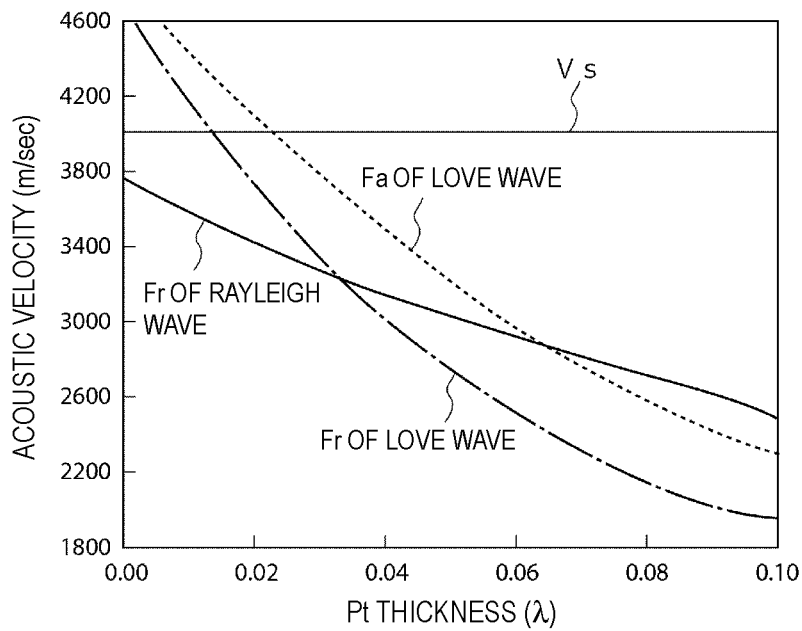
FIG. 6 is a graph illustrating changes in a resonant frequency Fr and an anti-resonant frequency Fa of a Love wave, and a resonant frequency Fr of a Rayleigh wave in accordance with a Pt thickness and an acoustic velocity.

FIG. 6 is a graph illustrating changes in a resonant frequency Fr and an anti-resonant frequency Fa of a Love wave, and a resonant frequency Fr of a Rayleigh wave in accordance with a Pt thickness and an acoustic velocity. In FIG. 6, a solid line indicates a change in the resonant frequency Fr of the Rayleigh wave. A broken line indicates the anti-resonant frequency Fa of the Love wave. A dot-dash line indicates a result of the resonant frequency Fr of the Love wave. Further, a thin line corresponds to an acoustic velocity Vs of a low-velocity transversal wave propagating in LiNbO$_3$.

Figure 7:
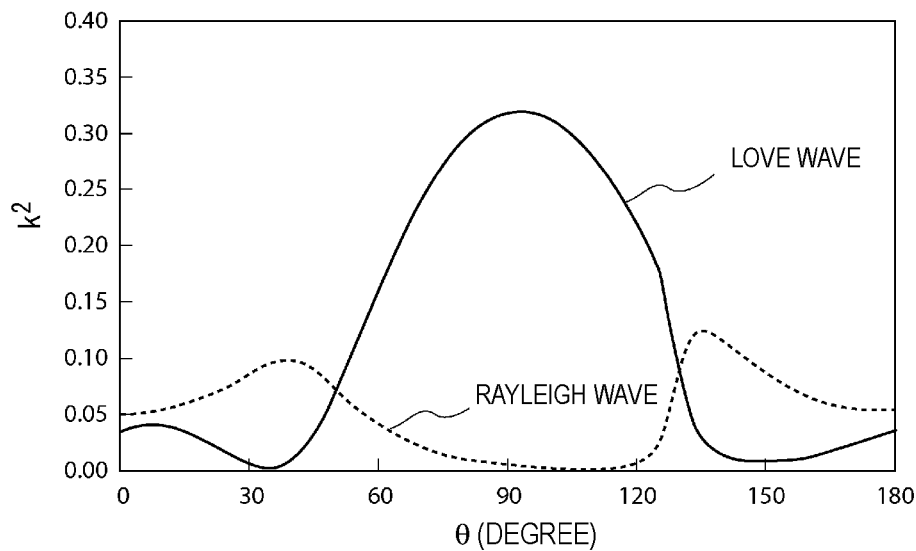
FIG. 7 is a graph illustrating a change in an electromechanical coupling coefficient k$^2$ of a Love wave and a Rayleigh wave in accordance with θ of Euler angles.
Figure 8:
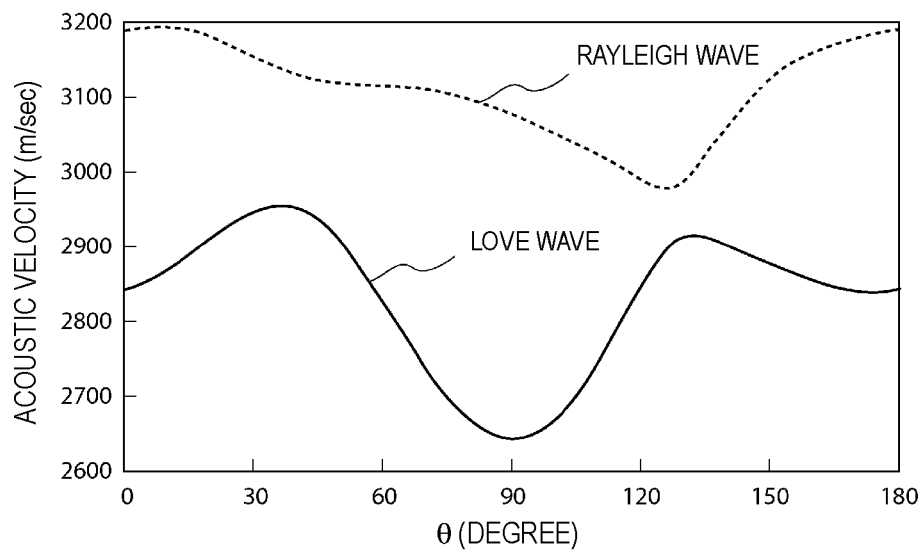
FIG. 8 is a graph illustrating a change in an acoustic velocity of a Love wave and a Rayleigh wave in accordance with θ of Euler angles.

FIG. 7 is a graph illustrating a relationship between θ of Euler angles and an electromechanical coupling coefficient k$^2$ in a Love wave and a Rayleigh wave in the case where the Pt thickness is about 0.05λ, for example. FIG. 8 is a graph illustrating a relationship among θ of Euler angles, the Love wave, and an acoustic velocity. In FIG. 7, a condition under which the electromechanical coupling coefficient k$^2$ of the Rayleigh wave spurious is no more than about 0.2% lies in a range of about −10° to about +6° from the above Formula (1A), and a condition under which the electromechanical coupling coefficient k$^2$ is no more than about 0.1% lies in a range of about −6° to about +5°, for example.

Figure 9:
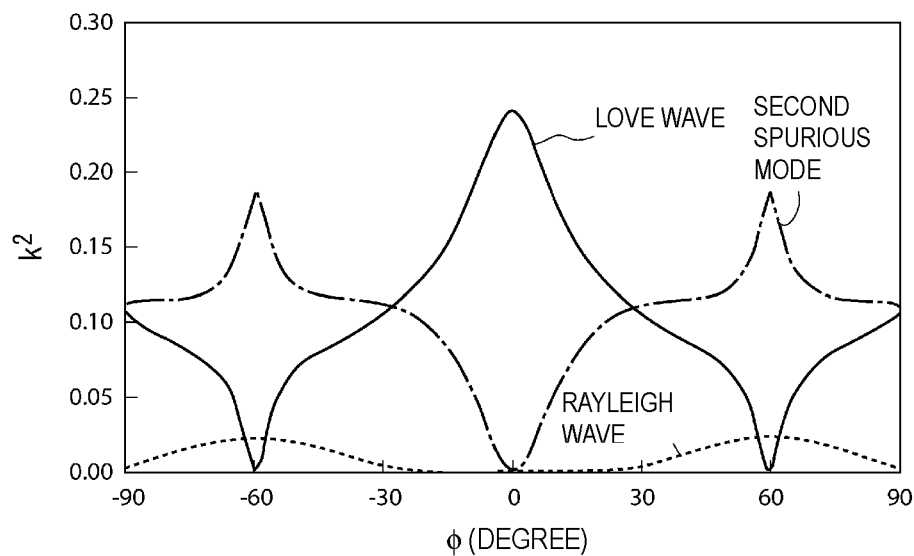
FIG. 9 is a graph illustrating a relationship between φ of Euler angles and an electromechanical coupling coefficient k$^2$ in a Love wave, a Rayleigh wave, and a second spurious mode.

Meanwhile, FIG. 9 is a graph illustrating a relationship between an electromechanical coupling coefficient k2 of a Love wave, a Rayleigh wave, and a second spurious mode and φ of Euler angles (φ, 115°, 0°) in the case where the Pt thickness is taken as about 0.04λ, for example.

In FIG. 9, a solid line indicates a result of the Love wave, a broken line indicates a result of the Rayleigh wave, and a dot-dash line indicates a result of the second spurious mode.

The second spurious mode is a spurious mode that appears separate from a Rayleigh wave in the case where φ takes an Euler angle other than approximately 0°. This spurious mode can be considered to be a mode generated by the coupling of an SH partial wave and a Love wave.

In FIG. 9, a range in which the electromechanical coupling coefficient k$^2$ of the Rayleigh wave spurious is no more than about 0.2% corresponds to a range where φ is about −27° to about +27°, and a range in which the coefficient is no more than about 0.1% corresponds to a range where φ is about −24° to about +24°, for example.

Further, a range in which the electromechanical coupling coefficient k$^2$ of the second spurious mode is no more than about 0.2% corresponds to a range where φ is about −1.5° to about +1.5°, and a range in which the coefficient is no more than about 0.1% corresponds to a range where φ is about −0.5° to about +0.5°, for example.

Figure 11:
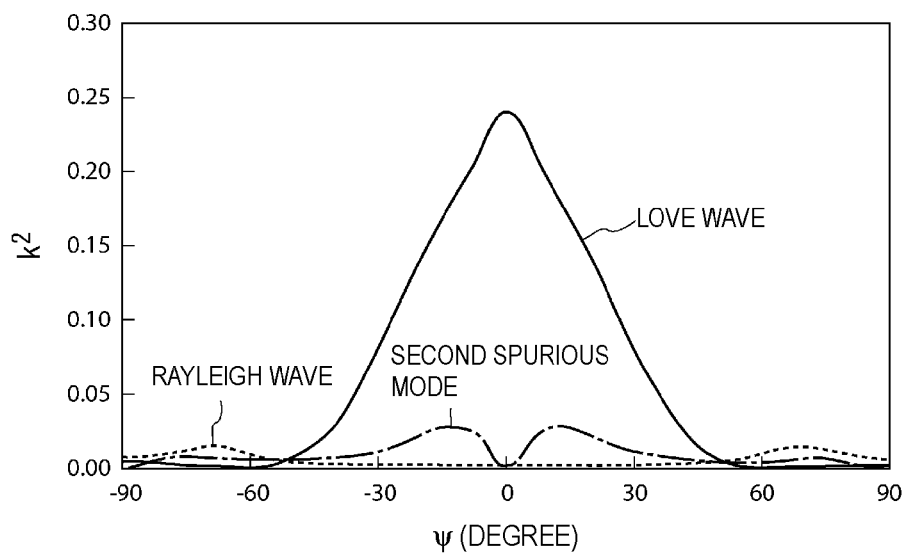
FIG. 11 is a graph illustrating a relationship between ψ of Euler angles and an electromechanical coupling coefficient k$^2$ in a Love wave, a Rayleigh wave, and a second spurious mode.

FIG. 11 is a graph illustrating a relationship between ψ of Euler angles (0°, 115°, ψ) and an electromechanical coupling coefficient k$^2$ in a Love wave, a Rayleigh wave, and the second spurious mode in the case where the Pt thickness is about 0.04λ, for example.

As is clear from FIG. 11, a range in which the electromechanical coupling coefficient k$^2$ of the Rayleigh wave spurious is no more than about 0.2% corresponds to a range where ψ is about −47° to about +47°, and a range in which the coefficient is no more than about 0.1% corresponds to a range where ψ is about −44° to about +44°, for example. Further, a range in which the electromechanical coupling coefficient k$^2$ of the second spurious mode is no more than about 0.2% corresponds to a range where ψ is about −1.3° to about +1.3°, and a range in which the coefficient is no more than about 0.1% corresponds to a range where ψ is about −0.6° to about +0.6°, for example.

As discussed above, it can be understood that the Rayleigh wave spurious, the second spurious mode, and the like are significantly reduced and made small and the electromechanical coupling coefficient k$^2$ of the Love wave is significantly increased and made large by adjusting the thickness H of the Pt film and the Euler angles (φ, θ, ψ).

In the case where the electromechanical coupling coefficient k$^2$ is greater than about 0.2, it is possible to lessen the degree of band extension to obtain a wider frequency band by shifting the frequency using the first inductance, the second inductance, and the like. Accordingly, Q-values of the first resonance circuit 7, the second resonance circuit 8, and the like are increased.

As a result, Q-values of the first and second variable resonance circuits are increased. As such, the electromechanical coupling coefficient $k^2$ is significantly increased and made large, the loss is significantly reduced and made small, and the steepness of the filter characteristic is significantly increased by increasing the Q-values.

In particular, from the results of FIGS. 5 through 12, it is preferable for the Pt film thickness H(λ) and the Euler angles (φ, θ, ψ) of LiNbO$_3$ to have the following relationship. This makes it possible to effectively increase the steepness of the filter characteristic as described above.

θ falls within a range of $-64960 \times H^3 + 19831 \times H^2 - 2068.4 \times H + 169.7 - 10°$ . . . (Formula 1) to $-64960 \times H^3 + 19831 \times H^2 - 2068.4 \times H + 169.7 + 6°$ . . . (Formula 2).

φ falls within a range of −27° to +27°.

ψ falls within a range of −47° to +47°.

Figure 10:
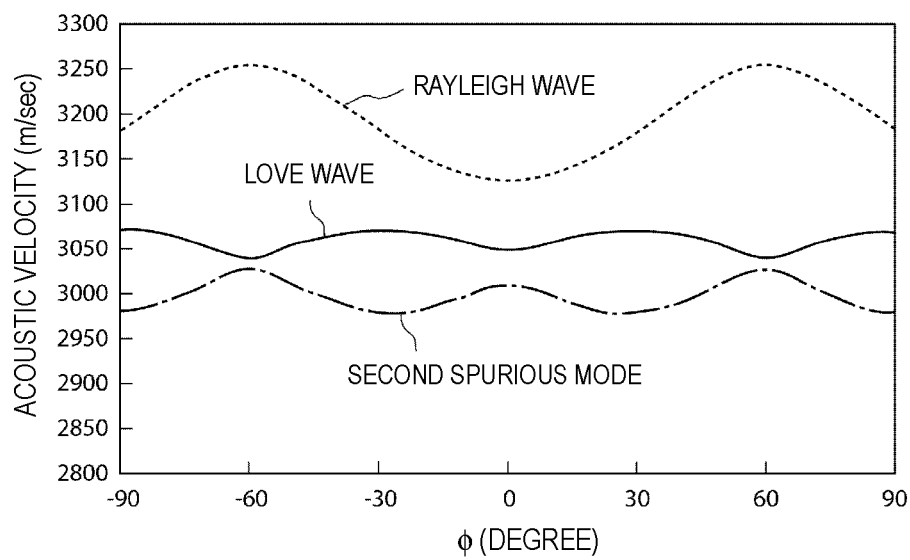
FIG. 10 is a graph illustrating a relationship between φ of Euler angles and an acoustic velocity in a Love wave, a Rayleigh wave, and a second spurious mode.
Figure 12:
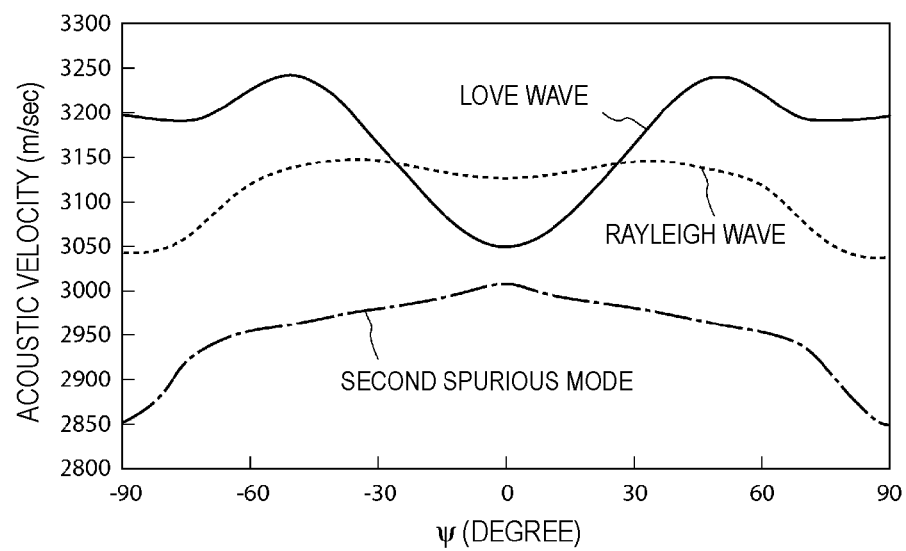
FIG. 12 is a graph illustrating a relationship between ψ of Euler angles and an acoustic velocity in a Love wave, a Rayleigh wave, and a second spurious mode.

With the Pt thickness and Euler angles that cause the Rayleigh wave spurious to be small as shown in FIG. 9 and FIG. 11, FIG. 10 is a graph illustrating a relationship between φ of the Euler angles and an acoustic velocity in the Love wave, the Rayleigh wave, and the second spurious mode, and FIG. 12 is a graph illustrating a relationship between ψ of the Euler angles and an acoustic velocity in the Love wave, the Rayleigh wave, and the second spurious mode. Because the electromechanical coupling coefficient $k^2$ of the Rayleigh wave becomes close to 0, Fr is equal to Fa.

As discussed above, the band width ratio (Fa−Fr)/Fr of the piezoelectric resonator using Love waves is small in comparison with the variable frequency width required in the tunable filter 1. Therefore, as discussed above, the first and second inductances are connected so as to define the first and second resonance circuits 7 and 8 of wide band.

In the case where the anti-resonant frequency, the resonant frequency, and the like of the piezoelectric resonator are shifted using the first and second inductances, Q-values of the first and second resonance circuits 7 and 8 are deteriorated as the shift amount of frequency is larger. In the case where the Q-values of the first and second resonance circuits 7 and 8 are deteriorated, Q-values of the first and second variable resonance circuits 9 and 10, which include the variable capacitances, are also deteriorated. Accordingly, in the case where a steep filter characteristic is required, it is preferable not to make the shift amount of frequency large by the first and second inductances.

Here, a case in which a steep filter characteristic is required on a lower frequency side of a variable frequency band and a gentle filter characteristic is required on a higher frequency side thereof is considered, for example. In this case, it is preferable to make the shift amount of frequency by the first and second inductances smaller on the resonant frequency Fr side of the first and second resonance circuits 7 and 8, and make the shift amount of frequency by the inductance larger on the anti-resonant frequency side Fa thereof.

Here, on the other hand, a case in which the same level of steepness is required on both the higher and lower frequency sides is considered. In this case, it is preferable to make the shift amounts of frequency by the inductance the same or substantially the same at both the resonant frequency and anti-resonant frequency of the first resonance circuit 7. This makes it possible to make the Q-values of a variable resonator on the lower frequency side and the higher frequency side substantially the same. As such, the filter characteristic exhibits substantially the same level of steepness on the lower frequency side and higher frequency side.

Figure 13:
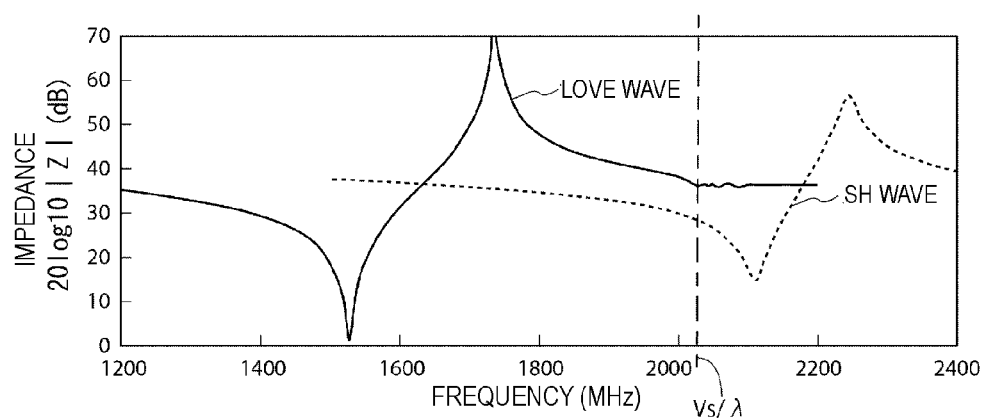
FIG. 13 is a graph illustrating an impedance characteristic of a piezoelectric resonator using Love waves and a piezoelectric resonator making use of SH type leakage waves.
Figure 14:
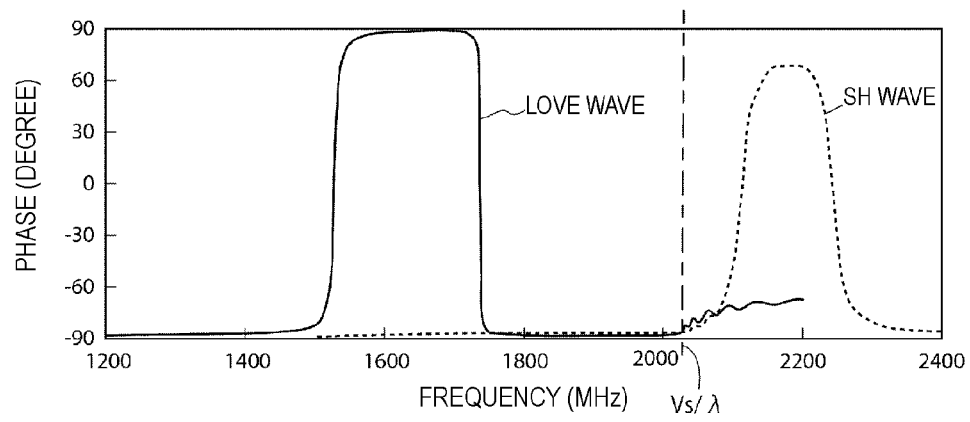
FIG. 14 is a graph illustrating a phase characteristic of a piezoelectric resonator using Love waves and a piezoelectric resonator making use of SH type leakage waves.
Figure 15A:
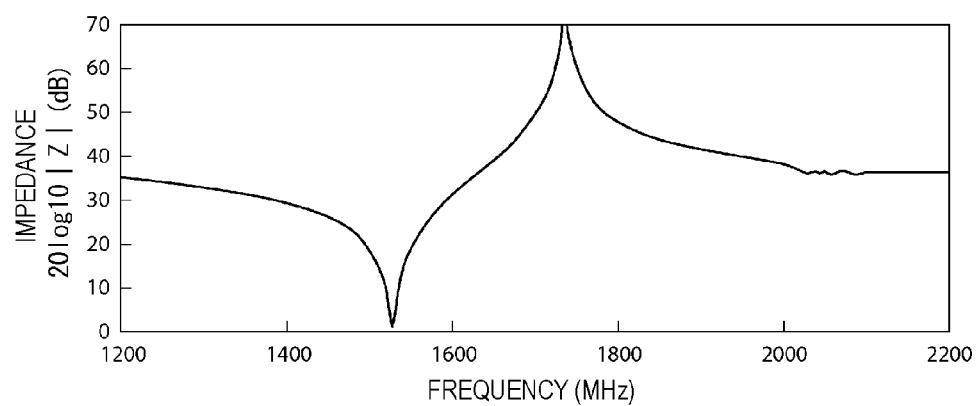
FIG. 15A is a graph illustrating an impedance characteristic of a first piezoelectric resonator.
Figure 15B:
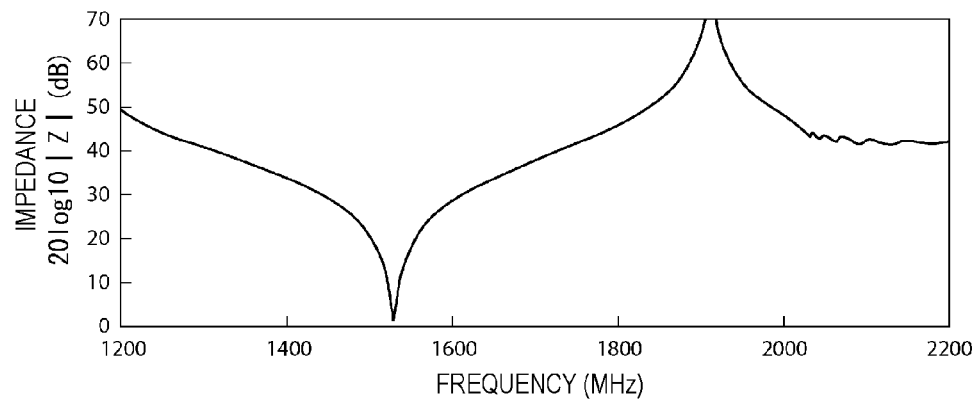
FIG. 15B is a graph illustrating an impedance characteristic in a case in which an inductance of 10 nH is connected to the first piezoelectric resonator in parallel.

Note that the acoustic velocity Vs of the low-velocity transversal wave propagating in LiNbO$_3$ with Euler angles (0°, θ, 0°) is about 4031 m/sec. FIG. 13 and FIG. 14 are graphs each illustrating resonant characteristics of a piezoelectric resonator using Love waves and a piezoelectric resonator using SH type leakage waves. In each of FIGS. 13 and 14, a solid line indicates the resonant characteristics of the piezoelectric resonator in the case of using Love waves with the Pt thickness being about 0.04λ, while a broken line indicates the resonant characteristics of the piezoelectric resonator in the case of using the SH type leakage waves with the Pt thickness being about 0.01λ, for example. It is to be noted that FIG. 13 illustrates an impedance characteristic and FIG. 14 illustrates a phase characteristic.

In each of FIGS. 13 and 14, a position of Vs/λ is indicated by a dot-dash line. In this case, because of λ=2 μm, the value of Vs/λ is approximately 2015 MHz, for example.

As is clear from FIGS. 13 and 14, it can be understood that the resonant characteristics of the piezoelectric resonator making use of the Love waves are significantly deteriorated when the frequency is beyond Vs/λ, that is, a frequency represented by a value obtained through the calculation in which the acoustic velocity Vs of the low-velocity transversal wave propagating in LiNbO$_3$ is divided by the wave length λ.

Figure 16A:
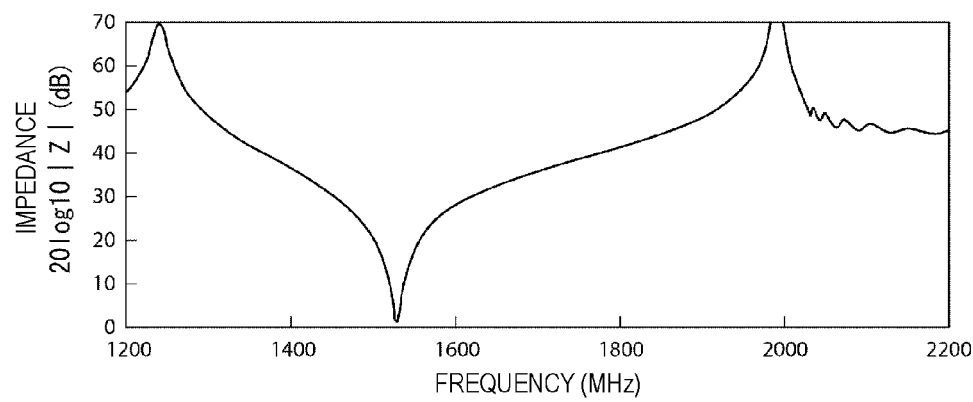
FIG. 16A is a graph illustrating an impedance characteristic in a case in which a first inductance of 7 nH is connected to the first piezoelectric resonator in parallel.
Figure 16B:
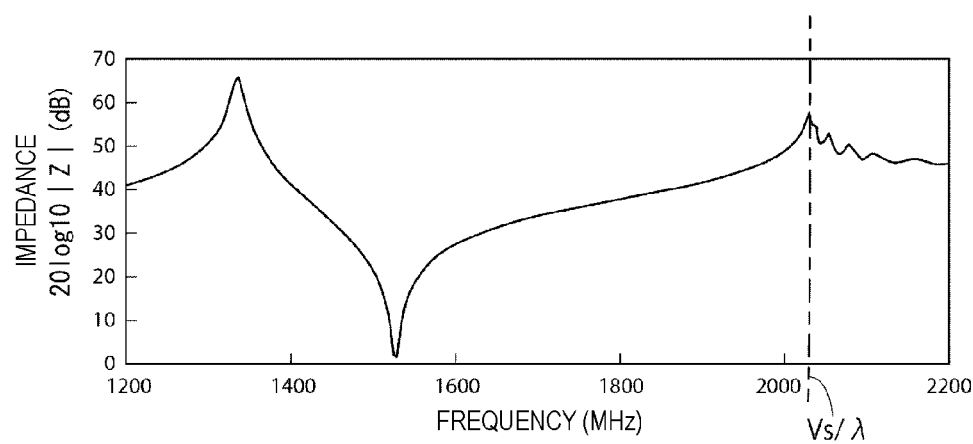
FIG. 16B is a graph illustrating an impedance characteristic in a case in which the first inductance of 5 nH is connected to the first piezoelectric resonator in parallel.
Figure 17:
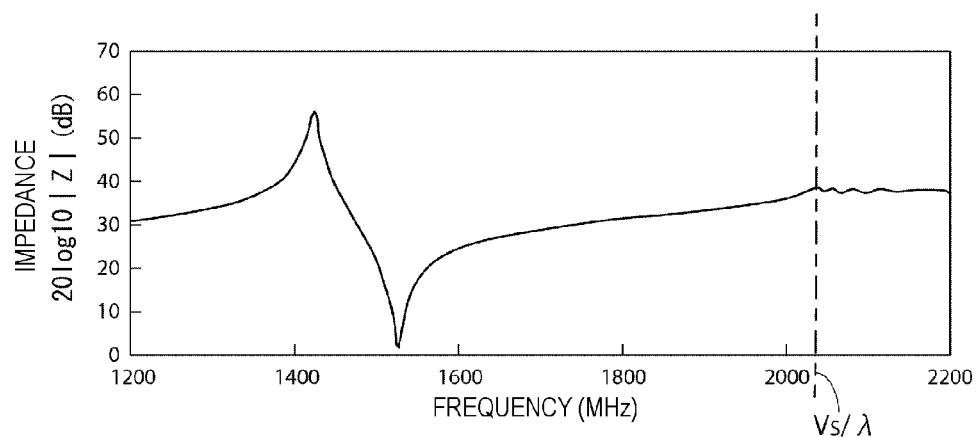
FIG. 17 is a graph illustrating an impedance characteristic in a case in which an inductance of 3 nH is connected to the first piezoelectric resonator in parallel.

FIGS. 15A and 15B, FIGS. 16A and 16B, and FIG. 17 each illustrate resonant characteristics of a resonance circuit that are as follows. An inductance in the form of the first parallel inductance preferably is connected in parallel to a piezoelectric resonator with a Pt thickness of about 0.04λ and using Love waves. Note that, however, in FIG. 15A, the parallel inductance is not connected. Further, the inductance values of the parallel inductance are set to be about 10 nH in FIG. 15B, 7 nH in FIG. 16A, 5 nH in FIG. 16B, and 3 nH in FIG. 17, respectively. In FIG. 16B and FIG. 17, the position of Vs/λ is additionally indicated by a dot-dash line.

As is clear from FIG. 15A through FIG. 17, it can be understood that in the resonance circuit of wide band in which the first parallel inductance is connected, the resonant characteristics are significantly deteriorated when the frequency is beyond Vs/λ and the anti-resonance disappears.

Accordingly, it can be understood that the resonant characteristics are also deteriorated in a frequency region on a higher frequency side relative to the above Vs/λ in the case where a variable resonator is provided by further connecting a variable capacitance to the resonance circuit of wide band formed of the piezoelectric resonator using Love waves and the inductance being connected to the piezoelectric resonator.

Therefore, in the tunable filter 1, Vs/λ is a limit of the variable frequency region on the higher frequency side. As such, in various preferred embodiments of the present invention, the pass band needs to be on a lower frequency side relative to Vs/λ across the overall variable frequency range. This makes it possible to not only increase the steepness of the filter characteristic but also effectively widen the frequency variable range.

In addition, it is more preferable, from FIG. 6, that the Pt thickness be not less than about 0.023λ, for example. In this case, the anti-resonant frequency Fa is able to be positioned on a lower frequency side by 1% relative to Vs/λ. It is further preferable that the Pt thickness H be not less than about 0.028λ, for example. In this case, the anti-resonant frequency Fa is able to be positioned on a lower frequency side by about 5% relative to Vs/λ. It is still further preferable that the Pt thickness H be not less than about 0.034λ, and the most preferable that the Pt thickness be not less than about 0.050λ, for example. In these cases, the anti-resonant frequency is able to be positioned on a lower frequency side by about 10% and a lower frequency side by about 20%, respectively, relative to Vs/λ, for example.

In the above preferred embodiment, the IDT electrode includes Pt. However, the IDT electrode may be formed of other types of metals.

In a case where the IDT electrode includes other metals than Pt, it is preferable that the range of θ be set as follows with the above-described Pt film thickness. That is, it is sufficient that the thickness of the IDT electrode is taken as H(λ), a ratio $P/P_{Pt}$ of a density P of the IDT electrode to a density $P_{Pt}$ of Pt is taken as A, and θ is set to a value between Formula 3 and Formula 4 given below, for example.

It is sufficient that θ falls within a range of $-64960\times(H/A)^3+19831\times(H/A)^2-2068.4\times H/A+169.7-10°$ . . . (Formula 3) to $-64960\times(H/A)^3+19831\times(H/A)^2-2068.4\times(H/A)+169.7+6°$ . . . (Formula 4), for example. Further, it is sufficient that φ falls within a range of −27° to +27°, and ψ falls within a range of −47° to +47°, for example.

It is to be noted that the IDT electrode may include laminated metal films. Since Pt has high resistivity, Al, whose resistivity is small, may be laminated on Pt, for example. In this case, resonant resistance is significantly reduced. Accordingly, the resonant characteristics in the first and second piezoelectric resonators are further improved.

In this case, as discussed above, it is sufficient that the density of the overall IDT electrode is determined in consideration of the Al density, the Pt density, and thicknesses of the respective metal films.

Figure 18:
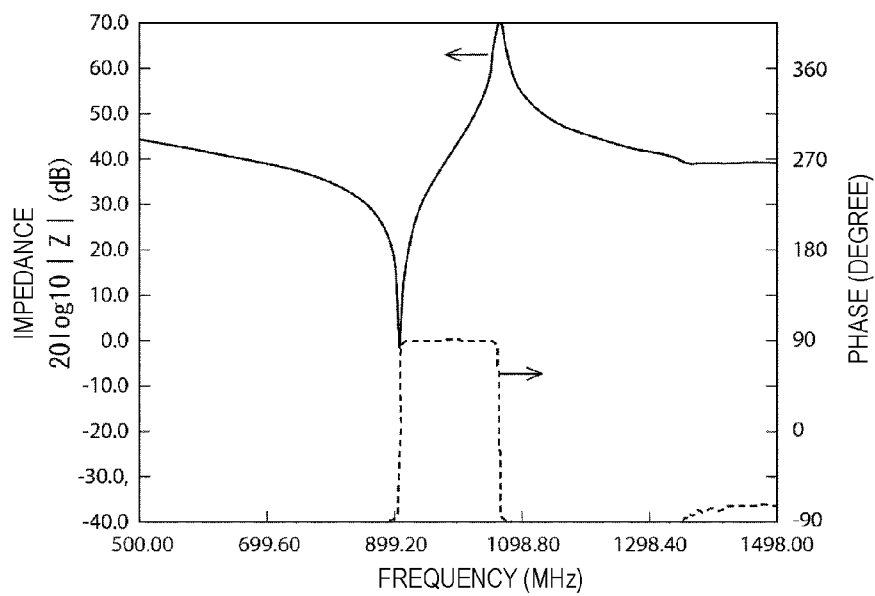
FIG. 18 is a graph illustrating resonant characteristics in a case where Euler angles of LiNbO$_3$ are (0°, 106°, 0°) and an IDT electrode in which an Al film is laminated on a Pt film is used.
Figure 19:
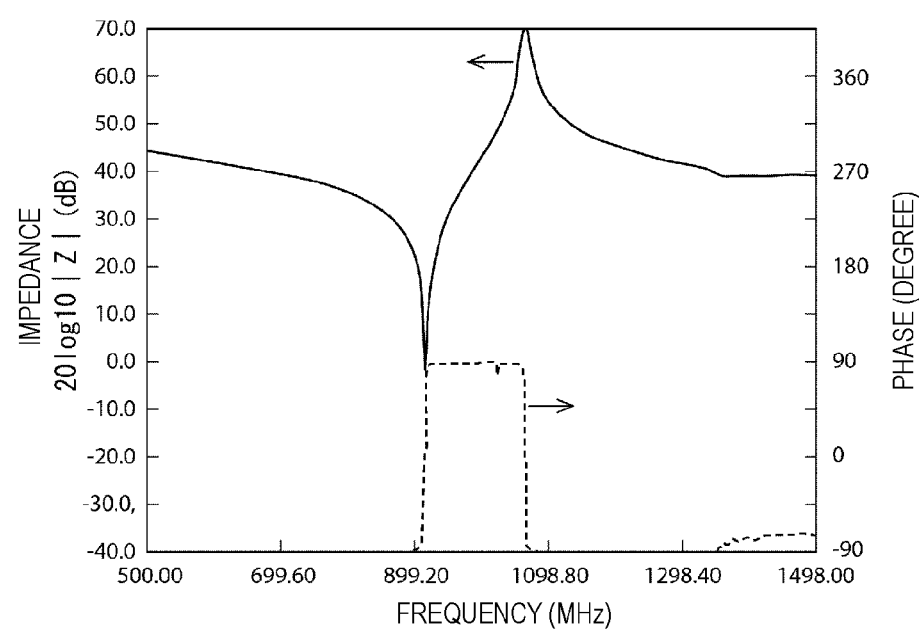
FIG. 19 is a graph illustrating resonant characteristics in a case where Euler angles of LiNbO$_3$ are (0°, 108°, 0°) and an IDT electrode in which an Al film is laminated on a Pt film is used.

FIG. 18 is a graph illustrating resonant characteristics in the case where Euler angles of $LiNbO_3$ are (0°, 106°, 0°) and an IDT electrode in which an Al film is laminated on a Pt film is used. FIG. 19 is a graph illustrating resonant characteristics in the case where Euler angles of $LiNbO_3$ are (0°, 108°, 0°) and an IDT electrode in which an Al film is laminated on a Pt film is used. In this case, the IDT electrode having the following laminated structure was provided on a $LiNbO_3$ substrate. In other words, the IDT electrode was provided with the metal films having the laminated structure as shown in Table 1.

Note that a NiCr film shown in Table 1 was disposed on the substrate side, and then the other layers are sequentially laminated in the order shown in the table.

TABLE 1

| Material | Thickness (nm) |
| --- | --- |
| Ti | 25 |
| Al - 1 wt % Cu | 210 |
| Ti | 25 |
| Pt | 100 |
| NiCr | 35 |

Note that a $SiO_2$ film with a thickness of about 20 nm was laminated on the above IDT electrode. The number of pairs of electrode fingers of the IDT electrode was 60, the number of pairs of electrode fingers of the reflectors was 25, and the electrode finger intersecting width was about 30λ in the IDT electrode, for example.

The IDT electrode including the laminated metal films as described above is about 153 nm in thickness when converted to the thickness of a Pt film in consideration of the thickness and density of the IDT electrode. In the case of λ=3 μm, the thickness corresponds to about 0.051λ. Accordingly, from FIG. 5, θ=107° is a condition under which the Rayleigh wave spurious is the smallest. As is clear from FIGS. 18 and 19, the Rayleigh wave spurious and the second spurious are small in the case where the Euler angles of $LiNbO_3$ are (0°, 106°, 0°) as well as (0°, 108°, 0°).

Accordingly, in various preferred embodiments of the present invention, as discussed thus far, it is sufficient that the favorable range of θ is determined based on a value obtained by the calculation in which a film thickness of the overall IDT electrode is divided by a ratio of the density of the overall IDT electrode to the Pt density.

In the present specification, the right-hand Euler angles described in the document "Elastic Wave Device Technical Handbook" (150th Committee on Acoustic Wave Device Technology of Japan Society for the Promotion of Science, first impression of first edition, 549 pages, issued on Nov. 30, 1991) are used as the Euler angles (φ, θ, ψ) for representing a cut surface of a substrate and a propagation direction of an elastic wave. That is, with respect to crystal axes X, Y, and Z of $Li_2B_4O_7$, the X axis is counterclockwise rotated by φ about the Z axis to obtain an Xa axis. Next, the Z axis is counterclockwise rotated by θ about the Xa axis to obtain a Z' axis. Then, a surface including the Xa axis and taking the Z' axis as a normal line is defined as a cut surface of the substrate. Further, the Xa axis is counterclockwise rotated by ψ about the Z' axis to set an X' axis direction as a propagation direction of the elastic wave.

The crystal axes X, Y, and Z of $Li_2B_4O_7$ given as initial values of the Euler angles are such that the Z axis is parallel to a c-axis, the X axis is parallel to any one of equivalent three-direction a-axes, and the Y axis takes a normal direction of a surface including the X axis and the Z axis.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A tunable filter comprising:
   a piezoelectric resonator;
   an inductance for band extension connected to the piezoelectric resonator; and
   a variable capacitance connected to the piezoelectric resonator; wherein
   the tunable filter uses Love waves;
   the piezoelectric resonator includes a $LiNbO_3$ substrate and an interdigital transducer (IDT) electrode provided on the $LiNbO_3$ substrate;
   a pass band and an attenuation region are present in a frequency region on a lower frequency side relative to a value obtained by a calculation in which an acoustic velocity of a low-velocity transversal wave propagating in the $LiNbO_3$ substrate is divided by a wave length defined by a period of the IDT electrode; and
   the IDT electrode includes a Pt film, and in a case where a film thickness of the Pt film is taken as H(λ) and Euler angles of the $LiNbO_3$ substrate are taken as (φ, θ, ψ), θ falls within a range of $-64960\times H^3+19831\times H^2-2068.4\times H+169.7-10°$ to $-64960\times H^3+19831\times H^2-2068.4\times H+169.7+6°$, φ falls within a range of −27° to +27°, and ψ falls within a range of −47° to +47°.

2. The tunable filter according to claim 1, wherein the thickness H of the Pt film is equal to or greater than about 0.023λ.

3. A tunable filter comprising:
   a piezoelectric resonator;
   an inductance for band extension connected to the piezoelectric resonator;

a variable capacitance connected to the piezoelectric resonator;
an input terminal; and
an output terminal; wherein
the tunable filter uses Love waves;
the piezoelectric resonator includes a LiNbO$_3$ substrate and an interdigital transducer (IDT) electrode provided on the LiNbO$_3$ substrate;
a pass band and an attenuation region are present in a frequency region on a lower frequency side relative to a value obtained by a calculation in which an acoustic velocity of a low-velocity transversal wave propagating in the LiNbO$_3$ substrate is divided by a wave length defined by a period of the IDT electrode;
the piezoelectric resonator includes a first piezoelectric resonator that includes an elastic wave resonator and is provided in a serial arm that connects the input terminal to the output terminal, and a second piezoelectric resonator that includes an elastic wave resonator and is provided in a parallel arm that connects the serial arm to a ground potential;
the inductance for band extension includes a first inductance that is connected to the first piezoelectric resonator and extends a relative band of the first piezoelectric resonator, and a second inductance that is connected to the second piezoelectric resonator and extends a relative band of the second piezoelectric resonator;
the variable capacitance includes a first variable capacitance that is connected to the first piezoelectric resonator and defines a first variable resonance circuit along with the first piezoelectric resonator and the first inductance, and a second variable capacitance that defines a second variable resonance circuit along with the second piezoelectric resonator and the second inductance; and
the IDT electrode includes a Pt film, and in a case where a film thickness of the Pt film is taken as H($\lambda$) and Euler angles of the LiNbO$_3$ substrate are taken as ($\varphi$, $\theta$, $\psi$), $\theta$ falls within a range of $-64960 \times H^3 + 19831 \times H^2 - 2068.4 \times H + 169.7 - 10°$ to $-64960 \times H^3 + 19831 \times H^2 - 2068.4 \times H + 169.7 + 6°$, $\varphi$ falls within a range of $-27°$ to $+27°$, and $\psi$ falls within a range of $-47°$ to $+47°$.

4. The tunable filter according to claim 3, wherein the thickness H of the Pt film is equal to or greater than about 0.023$\lambda$.

5. The tunable filter according to claim 4, wherein the first inductance includes a first serial inductance connected in series to the first piezoelectric resonator.

6. The tunable filter according to claim 3, wherein the first inductance includes a first parallel inductance connected in parallel to the first piezoelectric resonator.

7. The tunable filter according to claim 6, wherein the second inductance includes a second serial inductance connected in series to the second piezoelectric resonator.

8. The tunable filter according to claim 6, wherein the first variable capacitance includes at least one of a first serial variable capacitance connected in series to the first piezoelectric resonator and a first parallel variable capacitance connected in parallel to the first piezoelectric resonator.

9. The tunable filter according to claim 6, wherein the second variable capacitance includes at least one of a second serial variable capacitance connected in series to the second piezoelectric resonator and a second parallel variable capacitance connected in parallel to the second piezoelectric resonator.

10. The tunable filter according to claim 6, wherein the first and second piezoelectric resonators are provided on the same LiNbO$_3$ substrate.

11. The tunable filter according to claim 3, wherein the first inductance includes a first serial inductance connected in series to the first piezoelectric resonator.

12. The tunable filter according to claim 3, wherein the second inductance includes a second serial inductance connected in series to the second piezoelectric resonator.

13. The tunable filter according to claim 12, wherein the second inductance includes a second parallel inductance connected in parallel to the second piezoelectric resonator.

14. The tunable filter according to claim 3, wherein the second inductance includes a second parallel inductance connected in parallel to the second piezoelectric resonator.

15. The tunable filter according to claim 3, wherein the first variable capacitance includes at least one of a first serial variable capacitance connected in series to the first piezoelectric resonator and a first parallel variable capacitance connected in parallel to the first piezoelectric resonator.

16. The tunable filter according to claim 3, wherein the first and second piezoelectric resonators are provided on the same LiNbO$_3$ substrate.

17. The tunable filter according to claim 3, wherein the second variable capacitance includes at least one of a second serial variable capacitance connected in series to the second piezoelectric resonator and a second parallel variable capacitance connected in parallel to the second piezoelectric resonator.

18. A tunable filter comprising:
a piezoelectric resonator;
an inductance for band extension connected to the piezoelectric resonator; and
a variable capacitance connected to the piezoelectric resonator; wherein
the tunable filter uses Love waves;
the piezoelectric resonator includes a LiNbO$_3$ substrate and an interdigital transducer (IDT) electrode provided on the LiNbO$_3$ substrate;
a pass band and an attenuation region are present in a frequency region on a lower frequency side relative to a value obtained by a calculation in which an acoustic velocity of a low-velocity transversal wave propagating in the LiNbO$_3$ substrate is divided by a wave length defined by a period of the IDT electrode; and
in a case where a thickness of the IDT electrode is taken as H($\lambda$) and a ratio P/P$_{Pt}$ of a density P of the IDT electrode to a density P$_{Pt}$ of Pt is taken as A, among the Euler angles ($\varphi$, $\theta$, $\psi$), $\theta$ falls within a range of $-64960 \times (H/A)^3 + 19831 \times (H/A)^2 - 2068.4 \times H/A + 169.7 - 10°$ to $-64960 \times (H/A)^3 + 19831 \times (H/A)^2 - 2068.4 \times (H/A) + 169.7 + 6°$, $\varphi$ falls within a range of $-27°$ to $+27°$, and $\psi$ falls within a range of $-47°$ to $+47°$.

* * * * *